(12) United States Patent
Feight et al.

(10) Patent No.: US 6,963,197 B1
(45) Date of Patent: Nov. 8, 2005

(54) TARGETED TIMED RESET FAULT INDICATOR

(75) Inventors: Laurence Virgil Feight, Island Lake, IL (US); James Manley Duros, Chicago, IL (US); Kurt James Fenske, Gleason, WI (US)

(73) Assignee: E.O. Schweitzer Manufacturing Co., LLC., Mundelein, IL (US)

( * ) Notice: Subject to any disclaimer, the term of this patent is extended or adjusted under 35 U.S.C. 154(b) by 0 days.

(21) Appl. No.: 10/449,143

(22) Filed: May 30, 2003

Related U.S. Application Data

(60) Provisional application No. 60/384,608, filed on May 31, 2002.

(51) Int. Cl.$^7$ ............................................. G01R 19/14
(52) U.S. Cl. .................. 324/126; 324/117 R; 324/133
(58) Field of Search .............................. 324/126–127, 324/133, 512, 522, 117 R, 117 H; 340/660–664

(56) References Cited

U.S. PATENT DOCUMENTS

| | | |
|---|---|---|
| 4,063,171 A | 12/1977 | Schweitzer, Jr. |
| 4,234,847 A | 11/1980 | Schweitzer |
| 4,263,550 A * | 4/1981 | Schweitzer, Jr. ............ 324/133 |
| 4,438,403 A | 3/1984 | Schweitzer, Jr. |
| 4,456,873 A | 6/1984 | Schweitzer, Jr. |
| 4,495,489 A | 1/1985 | Schweitzer, Jr. |
| 4,788,619 A | 11/1988 | Ott et al. |
| 4,795,982 A * | 1/1989 | Schweitzer, Jr. ............ 324/508 |
| 4,904,932 A | 2/1990 | Schweitzer, Jr. |
| 5,677,678 A | 10/1997 | Schweitzer, Jr. |
| 6,016,105 A | 1/2000 | Schweitzer, Jr. |
| 6,133,723 A | 10/2000 | Feight |
| 6,133,724 A | 10/2000 | Schweitzer, Jr. et al. |
| 6,734,662 B1 * | 5/2004 | Fenske ....................... 324/127 |

* cited by examiner

*Primary Examiner*—Minh N. Tang
(74) *Attorney, Agent, or Firm*—Cook, Alex, McFarron, Manzo, Cummings & Mehler, Ltd.

(57) ABSTRACT

A fault indicator for indicating the occurrence of a fault in an electrical conductor is reset at a predetermined time after the fault is detected, such as about 4 hours. The fault indicator has a housing, a high capacity battery, a fault sensor, a display for indicating a fault condition, and a programmable controller with a sleep state that draws low quiescent current. As a result the battery is expected to last the lifetime of the fault indicator. The fault indicator may optionally include current inrush restraint and/or voltage inrush restraint to inhibit the controller from activating the display to the fault indicating condition during the inrush conditions. The electromagnetic field about the conductor causes an electrostatic sensor to develop a differential voltage signal between two electrodes of different areas for the voltage inrush restraint circuit. Auxiliary contacts are provided to remotely monitor the fault indicator.

15 Claims, 7 Drawing Sheets

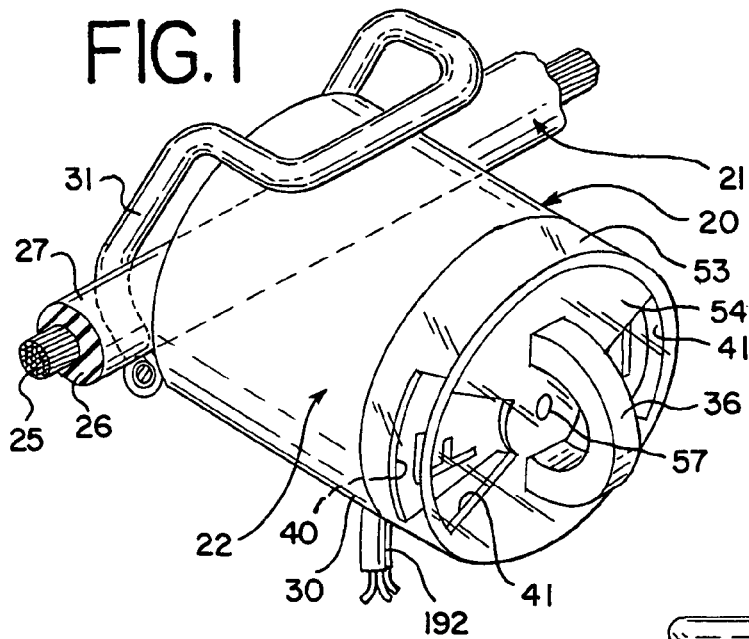
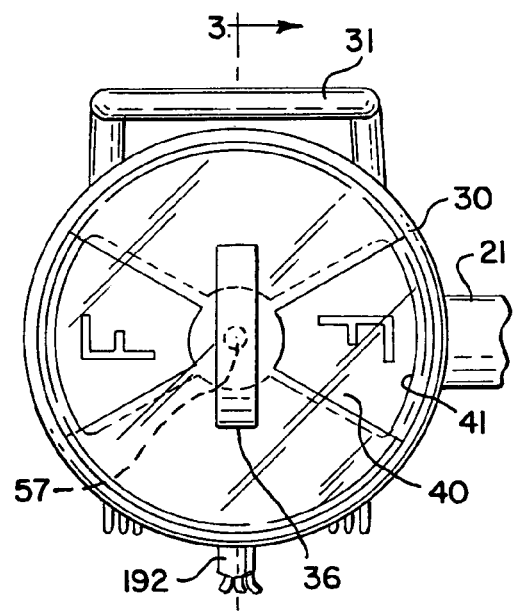
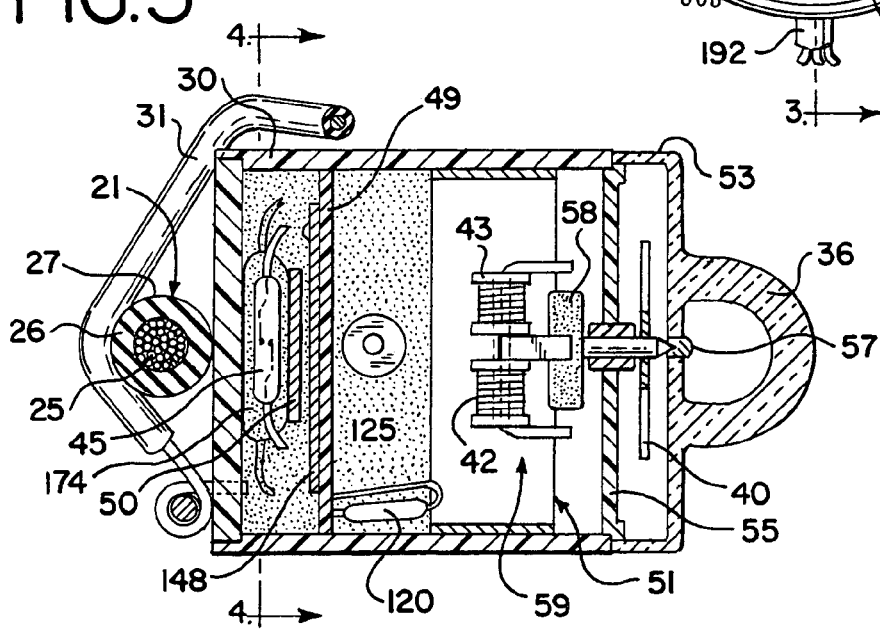

TARGETED TIMED RESET FAULT INDICATOR

CROSS-REFERENCE TO RELATED APPLICATION

This patent application is a non-provisional patent application of provisional patent application Ser. No. 60/384,608, filed on May 31, 2002; the right of priority of which is hereby claimed for this application.

BACKGROUND OF THE INVENTION

The present invention relates generally to current sensing devices for electrical systems, and more particularly to timed reset fault indicators for alternating current power systems.

Various types of self-powered fault indicators have been constructed for detecting electrical faults in power distribution systems, including clamp-on type fault indicators, which clamp directly over cables in the systems and derive their operating power from inductive coupling to the monitored conductor, and test point type fault indicators, which are mounted over test points on cables or associated connectors of the systems and derive their operating power from capacitive coupling to the monitored conductor. Such fault indicators may be either of the manually resetting type, wherein it is necessary that the indicators be physically reset, or of the self-resetting type, wherein the indicators are reset upon restoration of line current. Examples of such fault indicators are found in products manufactured by E. O. Schweitzer Manufacturing Company of Mundelein, Ill., and in U.S. Pat. Nos. 3,676,740, 3,906,477, 4,063,171, 4,234,847, 4,375,617, 4,438,403, 4,456,873, 4,458,198, 4,495,489, 4,974,329, 5,677,678, 6,016,105, 6,133,723 and 6,133,724.

Detection of fault currents in a monitored conductor by a fault indicator is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position.

Some prior art fault indicators utilize light emitting diodes (LEDs) to display a fault condition. However, LEDs require a source of power, such as an internal battery. Even if the LEDs are controlled to flash intermittently, the intermittent current drain from the internal battery is not insubstantial, and periodic replacement of the battery may be required. There is therefore a need for a battery-powered fault indicator with insubstantial current drain from a high capacity battery, such that the battery may never need replacement.

In certain other applications, the need arises for a fault indicator which will continue to display a prior fault condition for a predetermined amount of time, such as in the range of one hour to twenty-four hours, rather than self-resetting upon restoration of current in the conductor. The fault indicator should be capable of self-resetting after termination of the predetermined time.

Some of these applications also require voltage in-rush restraint and/or current in-rush restraint to prevent false tripping due to voltage and/or current surges, such as when a reclosing relay of a power distribution system closes.

In certain of these applications, the need also arises for auxiliary contacts in the fault indicator for indicating or recording the detection of a fault current at a location remote from the fault indicator. For example, where fault indicators are installed in each of multiple distribution circuits fed from a common source, it may be desirable to monitor the fault indicators at a central monitoring facility to enable a fault to be quickly isolated. Repair crews can then be efficiently dispatched to the known location of the fault.

Because of the compact construction and limited power available in self-powered fault indicators, it is preferable that the desired functions of the fault indicator be accomplished with minimal structure and with internal circuitry that has minimal current drain on a high capacity battery. The fault indicator must also provide highly reliable and extended operation over a number of years.

Accordingly, it is a general object of the present invention to provide a new and improved fault indicator having a high capacity battery and internal circuitry having insubstantial current drain on the battery such that the battery never needs replacement during the expected lifetime of the fault indicator.

Another object of the present invention is to provide a fault indicator with an electromagnetic flag indicator that is repositioned back to a non-fault position a predetermined amount of time after sensing a fault on a monitored conductor.

Yet another object of the present invention is to provide a fault indicator with voltage in-rush restraint and/or current in-rush restraint to avoid false tripping on voltage and/or current surges.

A further object of the present invention is to provide such a fault indicator with auxiliary contacts to provide contact closure indicative of fault occurrence.

Another object of the present invention is to provide a delayed trip upon sensing a fault condition.

A still further object of the present invention is to provide a timed reset at a predetermined time after occurrence of a detected fault current.

SUMMARY OF THE INVENTION

This invention is directed to a fault indicator for indicating the occurrence of a fault current in an electrical conductor. The fault indicator has a housing, a high capacity battery, an indicator flag visible from the exterior of the fault indicator upon the occurrence of a fault and which may be reset to a non-fault indicating position after the occurrence of the fault, and electronic circuitry for sensing a fault, for actuating the indicator flag to a fault indicating position and for resetting the indicator flag to a non-fault indicating position a predetermined time after the fault has occurred. Upon sensing a fault, the fault indicator has a delayed trip with the amount of delay varying for different applications. The electronic circuitry draws insubstantial current from the high capacity battery such that the battery never needs replacement during the expected lifetime of the fault indicator.

The electronic circuitry may also include voltage in-rush restraint and/or current in-rush restraint to avoid false tripping of the fault indicator during voltage and/or current surges. The voltage inrush restraint circuitry senses the loss of voltage in the conductor, such as by collapse of the electromagnetic field about the conductor, and then inhibits the fault indicator from incorrectly determining that a fault occurred due to the subsequent current inrush in the conductor when power is restored to the electrical system. The voltage inrush restraint circuitry utilizes a novel electrostatic sensor that is disposed in the end of the housing of the fault indicator near the conductor that is being monitored. The electrostatic sensor has spaced apart metallic plates of differing areas to develop a differential potential between the plates when in the presence of an electromagnetic field about the conductor. This differential potential is rectified and the rectified current charges a capacitor. During a current inrush condition, the potential established across the capacitor rises to a logic high level. This logic high level signal corresponds to a current inrush condition. This logic high level signal is used to inhibit any detection of a fault due to the subsequent current inrush condition, such that the detection of a fault under such circumstances will be inhibited.

The current inrush circuitry uses a current transformer that is also disposed in the housing of the fault indicator near the monitored conductor. The current transformer develops a current that is related to the current in the conductor. The current from the current transformer is rectified and supplied to a capacitor. During a current inrush condition, the potential across the inrush current capacitor will increase to a high logic level. This high logic level from the current inrush circuitry will inhibit any fault detected as a result of the current inrush condition.

Auxiliary contacts, also provided in the fault indicator, change state upon the occurrence of any fault to indicate that a fault has occurred, such as to a remote location, for recording information about any fault, for monitoring the electrical distribution system, or the like.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures in which like reference numerals identify like elements, and in which:

FIG. 1 is a perspective view of an electric field powered clamp-on fault indicator constructed in accordance with the invention and installed on a cable within a power distribution system.

FIG. 2 is a front view of the fault indicator of FIG. 1 showing the indicator flag in the fault indicating position.

FIG. 3 is a cross-sectional view of the fault indicator of FIGS. 1 and 2 taken along the sectional line 3—3 of FIG. 2.

DESCRIPTION OF THE PREFERRED EMBODIMENT

Figure 4:
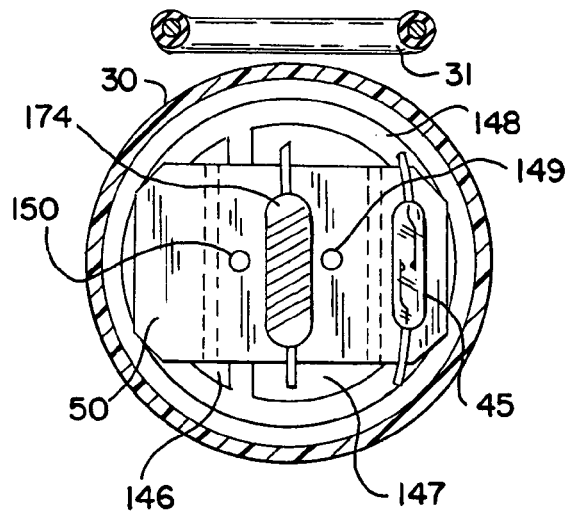
FIG. 4 is a cross-sectional view of the fault indicator of FIGS. 1–3 taken along the section line 4—4 of FIG. 3.
Figure 7:
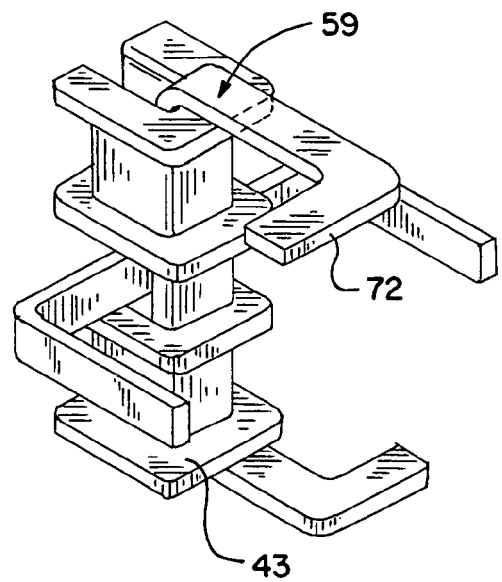
FIG. 7 is a perspective view of the assembled magnetic actuator of the indicator flag assembly.

Referring to the Figures, and particularly FIG. 1, a clamp-on timed reset fault indicator, generally designated 20, is constructed in accordance with the invention. Fault indicator 20 indicates fault currents in an electrical feeder or distribution cable, generally designated 21, and includes a circuit module, generally designated 22. In accordance with conventional practice, circuit module 22 is attached to the outer surface of the cable 21, which may include a central conductor 25, a concentric insulating layer 26 and an electrically grounded rubber outer sheath 27.

Circuit module 22 includes a housing 30 (FIG. 2) that contains electronic circuitry for sensing and responding to fault currents. The structure and operation of this circuitry will be discussed below. A clamp assembly 31 is suited for attaching module 22 to a monitored conductor, such as cable 21. An eye 36 on an end cap 53 may be provided to allow use of a conventional hotstick during installation or removal of fault indicator 20 about cable 21. End cap 53 forms part of the housing 30, and may be sonically welded to housing 30 to seal the interior of fault indicator 20 against contamination.

In accordance with conventional practice, circuit module 22 also includes a status indicating flag 40 to indicate whether a fault has occurred on cable 21. The flag 40 may be viewed from the exterior of fault indicator 20 through one or more generally transparent windows 41 disposed on the front of the end cap 53 of the fault indicator. Indicator flag 40 includes two indicator segments on either side of the axis of rotation which preferably each extend less than 90 degrees around the axis of rotation. Thus, when in the reset condition, no portion of indicator flag 40 is visible through windows 41.

As illustrated in FIG. 1, windows 41 may also extend into the sides of end cap 53 for better viewing of indicator flag 40. In operation, during normal current flow in conductor 21, indicator flag 40 is positioned by circuitry in circuit module 22 to be out of view. To this end, portions 54 of end cap 53 are generally opaque to conceal the indicator flag 40 from view when in the reset condition. Upon occurrence of a fault current in a monitored conductor, the indicator flag 40 is repositioned by the circuitry to present a red or fault-indicating surface that may be viewed through the windows 41 on the front face of module 22. Thus, the red or other highly visible colored surface of indicator flag 40 is only visible following occurrence of a fault.

With reference to FIG. 3, a partition 55 may be integral to housing 30 for rotatably supporting the indicator flag assembly including flag 40 and a flag actuator magnet 58. End cap 53 may be provided with a pivot point 57 for flag 40 to rotate about a generally horizontal axis, as seen in FIG. 3. Actuation of indicator flag 40 between reset and fault indicating positions is accomplished by flag actuator magnet 58 which is rotatably coupled to the flag by a shaft coupled to the flag 40. The shaft is maintained in alignment with the axis of the housing 30 by means of bearing surfaces disposed in partition 55 and pivot point 57.

Partition 55 also serves as a background for the windows 41 when flag 40 is in the reset position, and partition 55 may, for example, have a white surface to differentiate or contrast from the red color of flag 40 to clearly indicate a reset condition.

Figure 8:
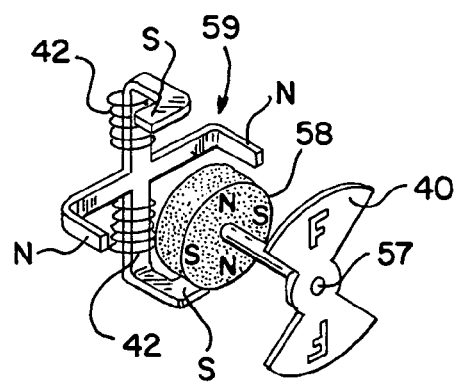
FIG. 8 is a diagrammatic view of the principal components of the indicator flag assembly in a reset indicating position.
Figure 9:
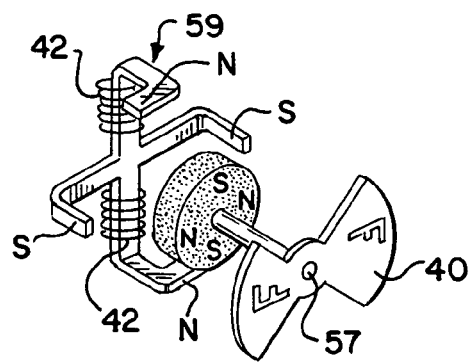
FIG. 9 is a diagrammatic view of the principal components of the indicator flag assembly in a fault indicating position.

The flag actuator magnet 58 is secured to, and rotates with, indicator flag 40. Flag actuator magnet 58 is formed of a magnetic material having a high coercive force, such as ceramic, and is magnetically polarized to form four magnetic poles of opposite polarity, as indicated in FIGS. 8 and 9, with like magnetic polarities along diameters of the magnet. That is, actuator magnet 58 has four poles of opposite polarity spaced at 90 degrees about the circumference of the magnet.

A four pole piece, generally designated 59 in FIGS. 3 and 7–9 is preferably formed of a magnetic material having a relatively low coercive force, such as chrome steel. The four poles of pole piece 59 are positioned to be in magnetic communication with flag actuator magnet 58. A wire winding 42 is wound on a bobbin 43 of pole piece 59.

Energization of winding 42 by current in one direction upon occurrence of a fault in conductor 21, and energization of winding 42 in the opposite direction upon a timed reset, is accomplished by means of circuitry contained within circuit module 22.

Operation of the indicator flag assembly is illustrated in FIGS. 8 and 9. The indicator flag assembly may be similar in construction and operation to that described in U.S. Pat. Nos. 4,495,489 and 6,016,105, both assigned to the assignee of the present invention. Actuator magnet 58 and hence indicator flag 40 are biased to the position and to the magnetic polarities shown in FIG. 8 when the fault indicator 20 is in a non-trip or reset condition by means of the generally cross-shaped magnetic pole piece 59. When the segments of the indicator flag 40 are vertically disposed as shown in FIG. 8, the flag segments are masked by the generally opaque segments 54 of the end cap 53 in FIG. 1. Thus, indicator flag 40 is not visible to the observer through windows 41.

However, upon detection of a fault in conductor 21, circuitry in circuit module 22 causes winding 42 of pole piece 59 to be momentarily energized which causes pole piece 59 to be remagnetized to the polarities shown in FIG. 9. As a result, the poles of flag actuator magnet 58 are repelled by adjacent like-polarity poles of the pole piece 59, and the indicator flag 40 is caused to rotate 90 degrees to the indicating position shown in FIG. 9. In this position, the red indicator segments of indicator flag 40 are visible through windows 41 and a lineman viewing the fault indicator is advised that a fault current has occurred in conductor 21.

The indicator flag 40 remains in the fault-indicating position shown in FIG. 9 until the poles of pole piece 59 are subsequently remagnetized back to the polarity shown in FIG. 8. In accordance with one aspect of the present invention, a momentary reset current is applied to winding 42 after the lapse of a predetermined time, for example, a couple to several hours. The momentary reset current applied to winding 42 is in an opposite direction to that applied upon detecting the fault condition. This reset remagnetization of pole piece 59 causes flag actuator magnet 58 to again be repelled by the adjacent poles of pole piece 59 which causes actuator magnet 58 and indicator flag 40 to rotate and to resume the vertical position shown in FIG. 8. At this time, fault indicator 20 is reset and indicator flag 40 is no longer visible.

Magnetic shielding for the pole piece 59 and the indicator flag assembly, including actuator magnet 58, may be provided by a band 51 disposed on a significant portion of the inside circumference of the housing 30. If band 51 is formed from brass or steel, a significant degree of magnetic shielding may be provided for the internal components.

Figure 10:
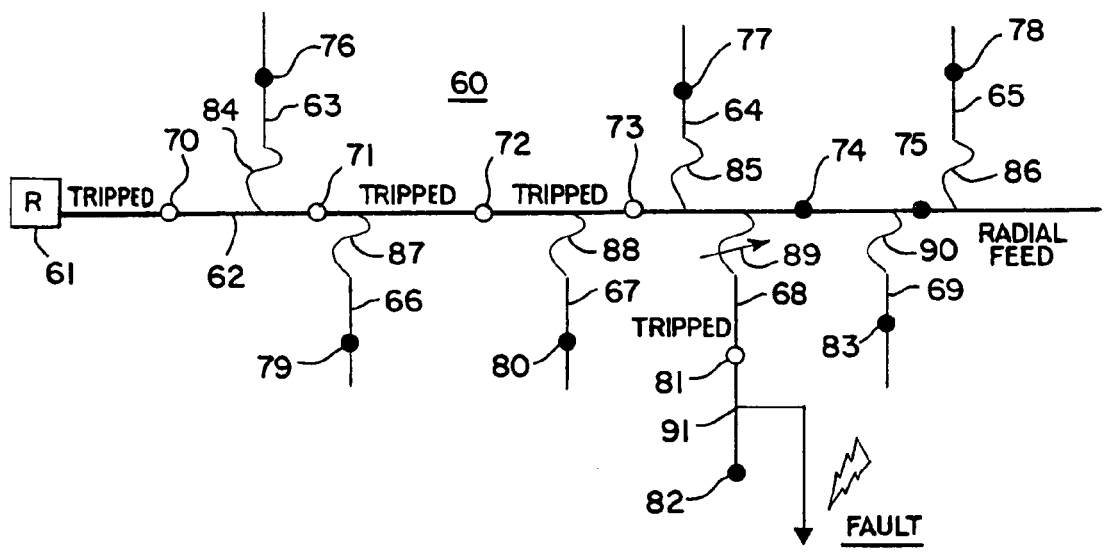
FIG. 10 is a diagrammatic illustration of an electrical distribution system employing a plurality of fault indicators to assist in locating a fault on the system.

In order to better understand some of the aspects of the present invention, the application of fault indicators of the type described above in an electrical distribution system will now be considered. Turning now to FIG. 10, a portion of an electrical distribution system, generally designated 60, is controlled by a reclosing relay 61. Electrical distribution system 60 may be of the radial feed type including a main line 62 and a plurality of radial lines 63–69. Main line 62 is typically a higher voltage overhead line. Radial lines 63–69 are typically lower voltage underground lines used in residential applications. For example, lines 63–69 often surface from their underground location at transformers in pad mounted enclosures. A plurality of fault indicators 70–82 are employed on the main and radial lines to assist in any fault that may occur on the system 60. If fault indicators are located on the main line between each radial feed line and on each radial feed line, the fault can be located by following the tripped or fault-indicating indicators 70–82.

In the example of FIG. 10, the tripped fault indicators 70–73 and 81 are shown with white centers. The untripped or reset fault indicators are shown with black centers. The system 80 also employs a plurality of fuses 84–90; one for each of the radial lines 63–69. In this example, a fault at a point 91, such as to ground, in line 68 is easily isolated by a lineman following the tripped fault indicators 70–73 and 81 as being between tripped fault indicator 81 and untripped fault indicator 82. Note that the fault at point 91 has also caused fuse 89 to blow.

Reclosing relays, such as relay 61, attempt to restore power to the distribution system 60 after a predetermined time, such as about 240 milliseconds (ms). Relay 61 may close for about 300 ms, and if the fault persists, relay 61 will again reopen for another 240 ms. If the fault remains after about three reclosing attempts, the relay 61 will remain in an open or locked out condition. In the example of FIG. 10, the relay 61 is likely to succeed in the first reclosing attempt because the blown fuse 89 now electrically isolates line 68, including the fault at point 91, from the remainder of the distribution system 60.

However, if fault indicators 70–73 are of the type that automatically reset upon the restoration of line current, fault indicators 70–73 will be reset before a lineman can view fault indicators 70–73. Thus, fault indicators 70–73 will not assist in quickly isolating the fault on the system 60. Instead, the lineman will have to try to find tripped fault indicator 81 and/or blown fuse 89. It will of course be appreciated that the fault indicators 70–83 are positioned at physically disparate locations on the lines 62–69 of the system 60 such that individual review of each fault indicator may be time consuming and inefficient.

In accordance with another aspect of the present invention, the fault indicator 20 has a timed reset to reset some hours after a fault occurs. Thus, in the example of FIG. 10, fault indicators 70–73 continue to display the fault indicating flag 40 after reclosing relay 61 restores current to main line 62. This enables a lineman to easily trace the fault past fault indicators 70 through 73 and 81 to a section of the line between fault indicators 81 and 82. The point of the fault 91 may then be located and repaired, or line 68 may be replaced. As will be understood hereinafter, the length of the timed reset may be in the range of 1 to 24 or more hours, and is preferably about 4 hours. Four hours normally provides sufficient time for a lineman or repair crew to review the tripped fault indicators to determine the part of the distribution system that has caused the fault.

Figure 11:
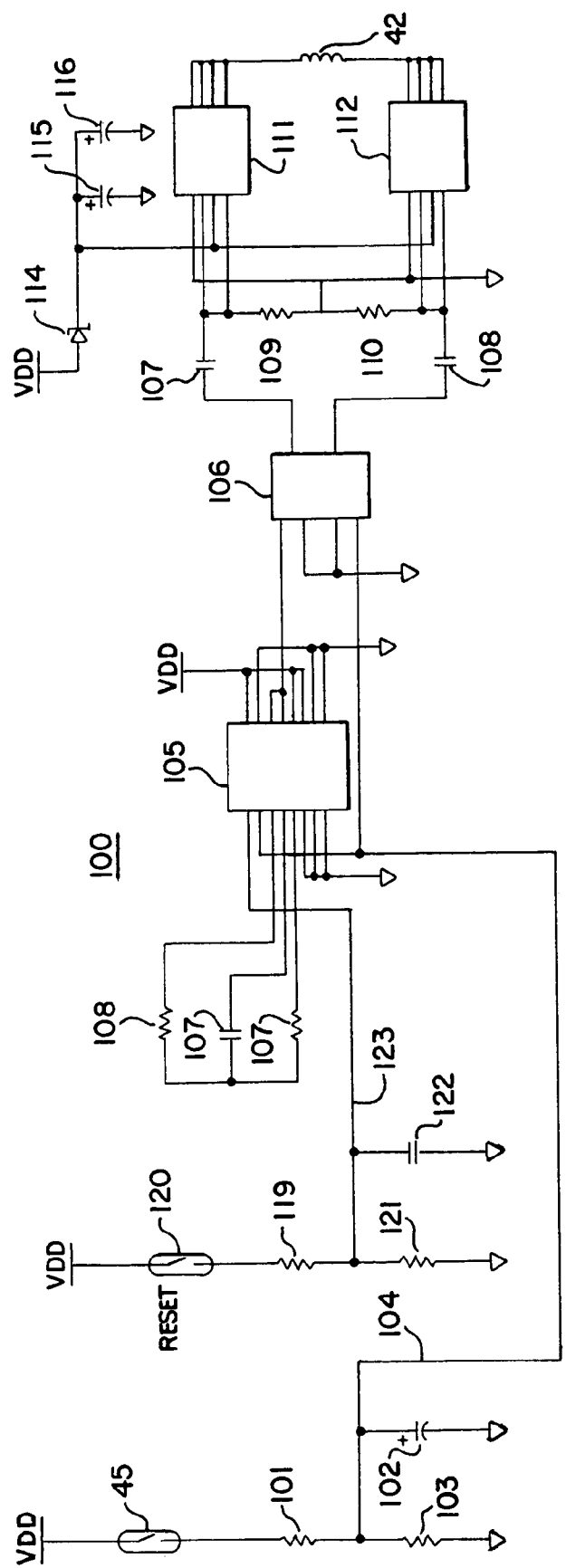
FIG. 11 is an electrical circuit diagram of the circuitry of the fault indicator shown in FIGS. 1–4.

Turning now to FIG. 11, the electronic circuitry for the fault indicator 20 is generally designated 100. The circuitry 100 is located on a circuit board 49 in housing 30 (FIG. 3). A magnetic reed switch 45 is connected between a positive voltage supply VDD and a resistor 101. As seen in FIG. 1, magnetic reed switch 45 is positioned with its axis perpendicular to and spaced from the axis of conductor 21 to respond to fault currents in the conductor in a manner well-known to the art. When magnetic reed switch 45 closes upon the occurrence of a fault current, capacitor 102 charges up toward the supply voltage VDD through resistor 101. Resistor 101 and capacitor 102 are selected to provide a time delay in providing a logic fault signal on a conductor 104 at the positive terminal of capacitor 102. For example, resistor 101 and capacitor 102 may be selected to provide about a 24 ms time delay for fault indicators utilized on a main line, such as for the fault indicators 70–75 on main line 62 in FIG. 10; and time delay of about one millisecond for fault indicators on a radial line, such as fault indicators 76–83 on radial lines 63–69 in FIG. 10. These 24 ms and 1 ms time delays are not critical in value and may vary over a range. For example, the 24 ms delay may range from about 1 ms to about 50 ms, and the selected value will often depend upon the specifications of the customer.

When the fault condition ends, a resistor 103, also connected to the positive terminal of capacitor 102, provides a discharge path to ground for capacitor 104. Resistor 103 is typically of much greater resistive value than resistor 101 so as to not appreciably shunt charging current from capacitor 102 when reed switch 45 closes upon occurrence of a fault.

Conductor 104 provides the fault signal from capacitor 102 to a reset pin 2 of a programmable timer 105. Programmable timer 105 is commercially available as part number MC14536B from ON Semiconductor of Phoenix, Ariz. Programmable timer 105 may alternatively be any programmable controller, including other commercially available microprocessors and microcontrollers that have a sleep state with a low quiescent current drain, which is further discussed below. Upon power up, decode out pin 13 initializes to a logic 1 state. Out 2 pin 5, 8-bypass pin 6, clock inhibit pin 7, VSS pin 8 and mono-in pin 15 of programmable timer 105 are all referenced to ground.

Out1 pin 4 and out2 pin 5 of programmable timer 105, in conjunction with in1 pin 3, form an RC oscillator. The frequency of oscillation is determined by resistor 106 and capacitor 107 connected in series across the out1 and out2 pins. Resistor 108, connected from the junction of resistor 106 and capacitor 107 to the in1 pin, is selected to be of greater resistive value than resistor 106. The RC oscillator is disabled when the decode out pin 13 is in a logic 1 state. Upon the decode out pin 13 assuming a logic 0 state, such as when the fault signal on conductor 104 assumes a logic 1 state at the reset pin 2, the RC oscillator is enabled. An internal shift register in programmable timer 105 is provided with the RC oscillator signal. This internal shift register stores a count from the oscillator. The shift register is subdivided into four sections which may be selected by inputs A, B, C or D, pins 9, 10, 11 and 12, respectively. With inputs A, B, C and D referenced to either the supply voltage VDD or to ground, and with the selection of the frequency of the RC oscillator by the values of resistor 106 and capacitor 107, a range of timing can be achieved. For example in the embodiment illustrated in FIG. 11 with the C and D inputs referenced to the supply voltage VDD, with the A and B inputs referenced to ground, and with resistor 106 and capacitor 107 selected for operation of the RC oscillator at about 60 Hertz, the shift register will reach a count that causes the decode out pin 13 to change to a logic 1 state after about four hours. When the decode out pin 13 assumes this logic 1 state, the RC oscillator is disabled. Other selections of the A, B, C and D input pins will provide timing between one and twenty-four hours. Of course, if the frequency of RC oscillator is lowered or if the internal shift register is provided with more stages, as by cascading, the time may be extended beyond 24 hours.

The decode out pin 13 of programmable timer 105 is connected to a set pin 6 of a flip-flop 106. Flip-flop 106 is commercially available as a type D flip-flop under part number MC14013B from ON Semiconductor of Phoenix, Ariz. Data pin 5 and clock pin 3 are referenced to ground. The fault signal on conductor 104 is routed to the reset pin 4 of flip-flop 106. Flip-flop 106 thus operates as a set/reset flip-flop. With a logic 1 state on set pin 6 from programmable timer 105 on power up, the Q output at pin 1 initially assumes a logic 1 state. However, when a fault is detected by magnetic reed switch 45 and conductor 104 then assumes a logic 1 state which is presented to reset pin 4 of flip-flop 106, output Q at pin 1 of flip-flop 106 will change from a logic 1 state to a logic 0 state.

Output Q on pin 1 of flip-flop 106 is coupled by a capacitor 107 to the gates of a pair of power MOSFET switches 111. Similarly, output Q-bar on pin 2 of flip-flop 106 is coupled by a capacitor 107 to the gates of another pair of power MOSFET switches 112. Switches 111 and 112 are commercially available from International Rectifier of El Segundo, Calif. under part number IRF7307. Gates G1 and G2 of switches 111 and 112 are referenced to ground through resistors 109 and 110, respectively. Sources S1 of each switch 111 and 112 are referenced to ground, while sources S2 of each switch 111 and 112 are referenced to the voltage supply VDD through a Schottky barrier diode 114. Also connected to the sources S2 of switches 111 and 112 are a pair of capacitors 115 and 116. The drains of MOSFET switches 111 are connected to one end of the pole piece winding 42, and the drains of MOSFET switches 112 are connected to the other end of winding 42.

The overall operation of circuit 100 will now be considered. When a fault causes magnetic reed switch 45 to close, a logic 1 state on conductor 104 is presented to the reset input at pin 4 of flip-flop 106. This logic 1 state on reset pin 4 causes the Q output on pin 1 to transition from a logic 1 state to a logic 0 state. At the same time, the Q-bar output on pin 2 of flip-flop 106 transitions from a logic 0 state to a logic 1 state. Capacitor 107 thus couples a negative pulse to the gates of switch 111 while capacitor 108 couples a positive pulse to the gates of switch 112. Current is then conducted by switches 111 and 112 in a first direction through winding 42 to cause indicator flag 40 to rotate to the fault indicating position shown in FIG. 9. For example, the pulses at the gates of switches 111 and 112 may render the switches conductive for about 100 ms and to conduct about 800 milliamperes (mA) through winding 42.

At the same time that the fault signal on conductor 104 rendered switches 111 and 112 conductive to move indicator flag 40 to the fault indicating position, the fault signal on conductor 104 was also presented to the reset pin 2 of the programmable timer 105. A logic 1 signal on the reset pin causes decode out pin 13 to assume a logic 0 state which enables the RC oscillator. After a predetermined time, such as about four hours, a maximum count in the shift register of programmable timer 105 will cause decode out pin 13 to be set to a logic 1 state. This logic 1 state disables the RC oscillator. The logic 1 state is also presented to the set pin 6 of flip-flop 106, causing its Q output to transition from a logic 0 state to a logic 1 state, and its Q-bar output to transition from a logic 1 state to a logic 0 state. These transitions in the outputs of the flip-flop result in capacitor 107 coupling a positive pulse to the gates of switch 111 and in capacitor 108 coupling a negative pulse to the gates of switch 112. This polarity of pulses renders opposite MOSFETs in switches 111 and 112 conductive to thereby conduct current through winding 42 in a second direction. The resulting change in magnetic polarities of the pole piece 59 causes indicator flag 40 to rotate to the reset position shown in FIG. 8. Fault indicator 20 is thus reset after a predetermined time from when it first assumed the fault indicating position.

Rather than waiting for the predetermined reset time to elapse, fault indicator 20 may be manually reset at any time. To this end, a reset magnetic reed switch 120 is disposed in the housing 30 in FIG. 3, preferably at a generally perpendicular angle to conductor 21. Magnetic reed switch 120 may be manually closed with a permanent magnet tool in a manner known to the art. With reference to the circuit diagram of FIG. 11, reset switch 120 is connected in series with a resistor 119 between the supply voltage VDD and a capacitor 122 to provide a reset signal on a conductor 123 when switch 120 is closed. The reset signal on conductor 123 is coupled to the set input 1 of programmable timer 105 to set decode out pin 13 to a logic 1 state. Portions of circuit 100 will be responsive to the logic 1 state at decode out pin 13 in a manner already described, as when the shift register in programmable timer 105 causes the decode out pin to transition to a logic 1 state to cause fault indicator 20 to assume the reset position. Resistor 121 provides a discharge path for capacitor 122 when the reset reed switch opens.

In accordance with another aspect of the present invention, a high capacity battery 125 in FIG. 3 supplies the operating supply voltage VDD for the circuitry 100 in FIG. 11. Battery 125 is preferably a thionyl chloride lithium battery, such as type TL-593-S manufactured by TADIRAN, Ltd. of Israel, which provides a constant 3.6 volt output to depletion. This battery has a nominal capacity rating of 2.4 ampere-hours.

The manufacturers' specifications for the programmable timer 105, the flip-flop 106 and the switches 111 and 112 indicate typical quiescent current drain of far less than one microampere at 25° C. (77° F.) and at a supply voltage of 5 volts. Quiescent current drain will be even less at the 3.6 volt supply voltage of battery 125. Maximum quiescent current drain for the circuit components 105, 106, 111 and 112 at 5 volts and 25 degrees C. is 5, 1, 1 and 1 microamperes, respectively, for a worst case total of 8 microamperes. Similar quiescent current drain considerations, at a high temperature of 85° C. (185° F.), result in about 100 microamperes of quiescent current drain. This translates into approximately 8.7 years of battery life at this higher temperature of course, the fault indicator 20 rarely encounters these higher temperatures, especially for sustained periods of time.

Of much greater drain on the battery 125 is the 800 mA current conducted through winding 42 during fault and reset for a total of approximately 200 ms. Given the capacity of battery 125, it can be shown that about 50,000 cycles of setting and resetting of indicator flag 40 will occur before the battery 125 is exhausted. However, if fault indicator 20 has about a four hour delayed reset time, the fault indicator cannot recycle more than six times per day for a maximum of about 22,000 times in 10 years. Thus, even under worst-case conditions, battery 125 will provide operating current for fault indicator 20 for well in excess of 10 years without needing replacement.

Due to the typical outdoor environmental conditions that the fault indicators 20 are subjected to when installed on the conductors of a power distribution system, 10 years is about the expected lifetime of these fault indicators. Advances in the state of the technology can also be expected to obsolete fault indicators in about 10 years. Thus, the low current drain of circuitry 110 in combination with the high capacity of battery 125 provides a fault indicator 20 in which the battery will realistically last the lifetime of the fault indicator, without any needed or required replacement of the battery during the fault indicator's operative lifetime.

By contrast, a fault indicator that utilizes an LED to display a fault condition, instead of an indicator flag 40, draws about 180 times as much current compared to fault indicator 20. These calculations assume that the LED is operative during the four hour timed reset, that the LED is on for about 200 ms and off for 1.8 seconds (10 percent duty cycle) and that the LED draws a 20 ma pulse while on. Under these comparable conditions, a LED fault indicator would need fairly frequent replacement of a high capacity battery, such as battery 125, especially over a period of 10 years.

Figure 12D:
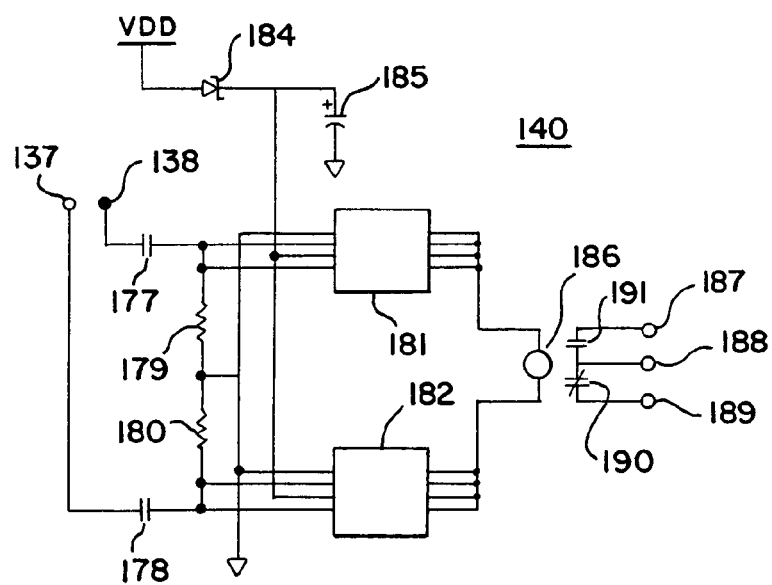
FIG. 12D is an electrical circuit diagram, to be used in conjunction with the electronic circuit diagram of FIG. 12A, to implement an auxiliary contact indication of a fault condition.
Figure 12A:
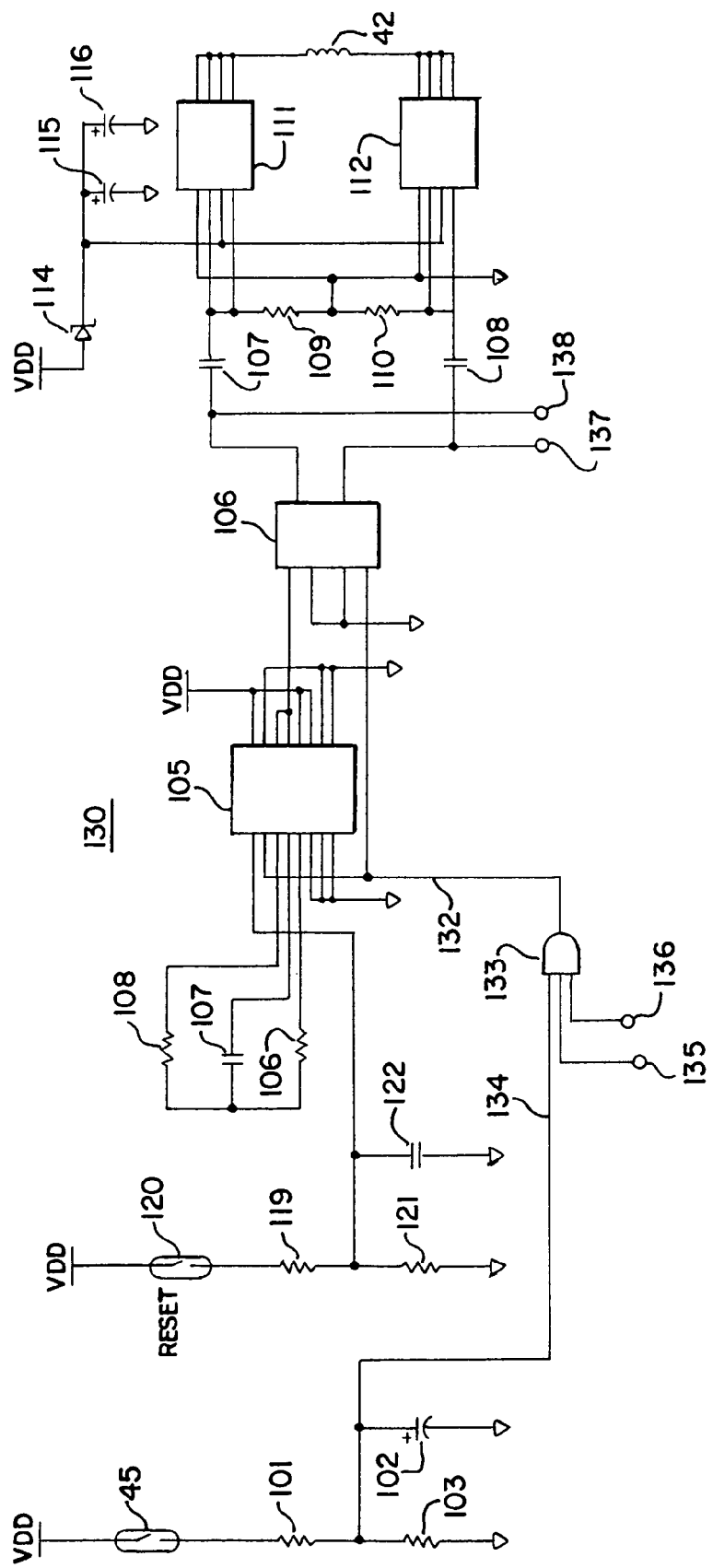
FIG. 12A is a portion of an electrical circuit diagram of the circuitry of the fault detector shown in FIGS. 1–4 when employing the optional features in the circuit diagrams of FIGS. 12B, 12C and/or 12D.

An alternative embodiment of the electronic circuitry, generally designated 130, for employing optional features such as voltage in-rush restraint, current in-rush restraint and auxiliary contacts, is illustrated in FIG. 12A. Alternative circuitry 130 is similar in structure and operation to the previously described circuitry 100 in most respects. However, a triple input AND gate 133 is interposed in the fault signal line between capacitor 102 and the reset pin 2 of the programmable timer 105. In circuitry 130, a conductor 134 connects capacitor 102 to one of the input pins to AND gate 133. The output pin of AND gate 133 is connected to the reset pin 2 of programmable timer 105. Additional input pins of AND gate 133 are brought out to terminals 135 and 136 to connect to similarly numbered terminals to receive an output signal from a voltage in-rush restraint circuit, generally designated 138 in FIG. 12B, and to receive an output signal from a current in-rush restraint circuit, generally designated 139 in FIG. 12C.

Another difference between circuits 100 and 130 is that circuitry 130 has the Q and Q-bar terminals of flip-flop 106 brought out to terminals 138 and 137, respectively. An auxiliary contact circuit, generally designated 140 in FIG. 12D, has similarly numbered terminals 137 and 138 for connection to circuitry 130 to provide auxiliary contacts indicative of the fault indicating state of fault indicator 20.

It will be appreciated that the voltage in-rush restraint 138, the current in-rush restraint 139 and the auxiliary contacts 140 may be implemented in any combination. For example, if voltage in-rush restraint 138 is desired, but not current in-rush restraint 139, AND gate 133 may be a two-input gate, or the spare third input terminal 136 may be connected to the supply voltage VDD through a voltage pull-up resistor in a manner similar to resistor 141 in FIG. 12C. Most of the circuitry in the voltage in-rush restraint circuit 138 and the current in-rush restraint circuit 139 is supplied from an electrostatic assembly 145 or an inductive pickup 174. Thus, addition of circuits 138 and 139 does not appreciably change the quiescent current drain analysis above, including the battery life considerations.

A novel electrostatic assembly 145 (FIG. 12B) includes a generally rectangular and flat metallic plate 50 overlying an insulating substrate 148 (FIGS. 4 and 5) with a pair of metal electrodes 146 and 147 thereon. For example, metallic plate 50 may be spaced apart from substrate 148 by small insulators so that good electrostatic coupling exists between metal plate 50 and electrodes 146 and 147. For example, metallic plate 50 may be spaced from substrate 148 in the range of about 3 millimeters to about 15 millimeters, and preferably about 7 millimeters. Substrate 148 with the electrodes 146 and 147 thereon may be fabricated by any suitable means, including printed circuit board techniques, deposition of metal on a ceramic substrate or by physically adhering metal foil onto a phenolic base. For example, the electrodes 146 and 147 may be a copper-nickel alloy foil about 10 to 12 thousandths of an inch (0.25 to 0.30 mm) thick. Metallic plate 50 is preferably provided with one or more apertures, such as 149 and 150 for good flow of a potting compound in and about the electrostatic assembly. For example, a urethane-based potting compound may be used, such as that commercially available under the BIWAX brand from the Biwax Corporation of Des Plaines, Ill. BIWAX is a registered trademark owned by the Biwax Corporation.

With reference to FIG. 3, the entire end of housing 30 which houses the magnetic reed switch 45, magnetic reed switch 120, inductive pickup 174, electrostatic pickup plate 50 and substrate 148, battery 125 and circuit board 49 may be potted with the potting compound.

Figure 5:
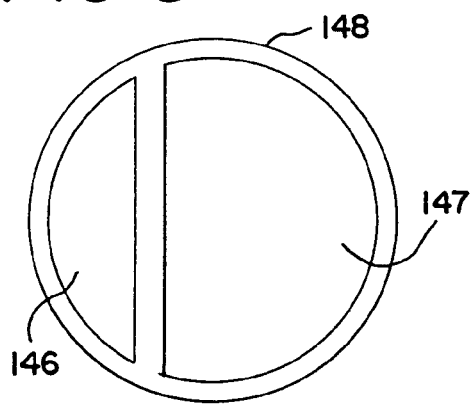
FIG. 5 is an enlarged view of a first embodiment of an electrostatic sensor for sensing the electromagnetic field around the conductor of the power distribution system, and which is also partially shown in FIG. 4.

As seen in FIG. 5, electrodes 146 and 147 are preferably of different area such that differences in charge on electrodes 146 and 147 will develop a differential electrical signal between electrodes 146 and 147. For example, the area of electrode 147 may be about three times the area of electrode 146.

Figure 6:
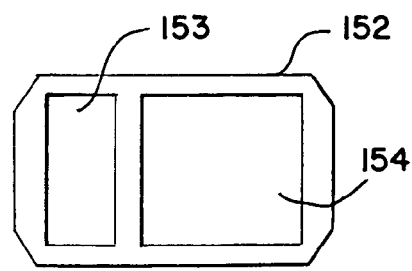
FIG. 6 is an enlarged view of a second embodiment of the electrostatic sensor shown in FIG. 5.

Illustrated in FIG. 6 is an alternative embodiment of the substrate 148 in FIG. 5. A substrate 152 of insulating material is of the same approximate rectangular configuration as metal plate 50. Generally rectangular metallic electrodes 153 and 154 are deposited on or adhered to the substrate 152. Electrode 154 is of greater area than electrode 153 for the same reasons and same purpose as electrodes 146 and 147 in FIG. 5. Electrode 154 may be about three times the area of electrode 153.

Figure 12B:
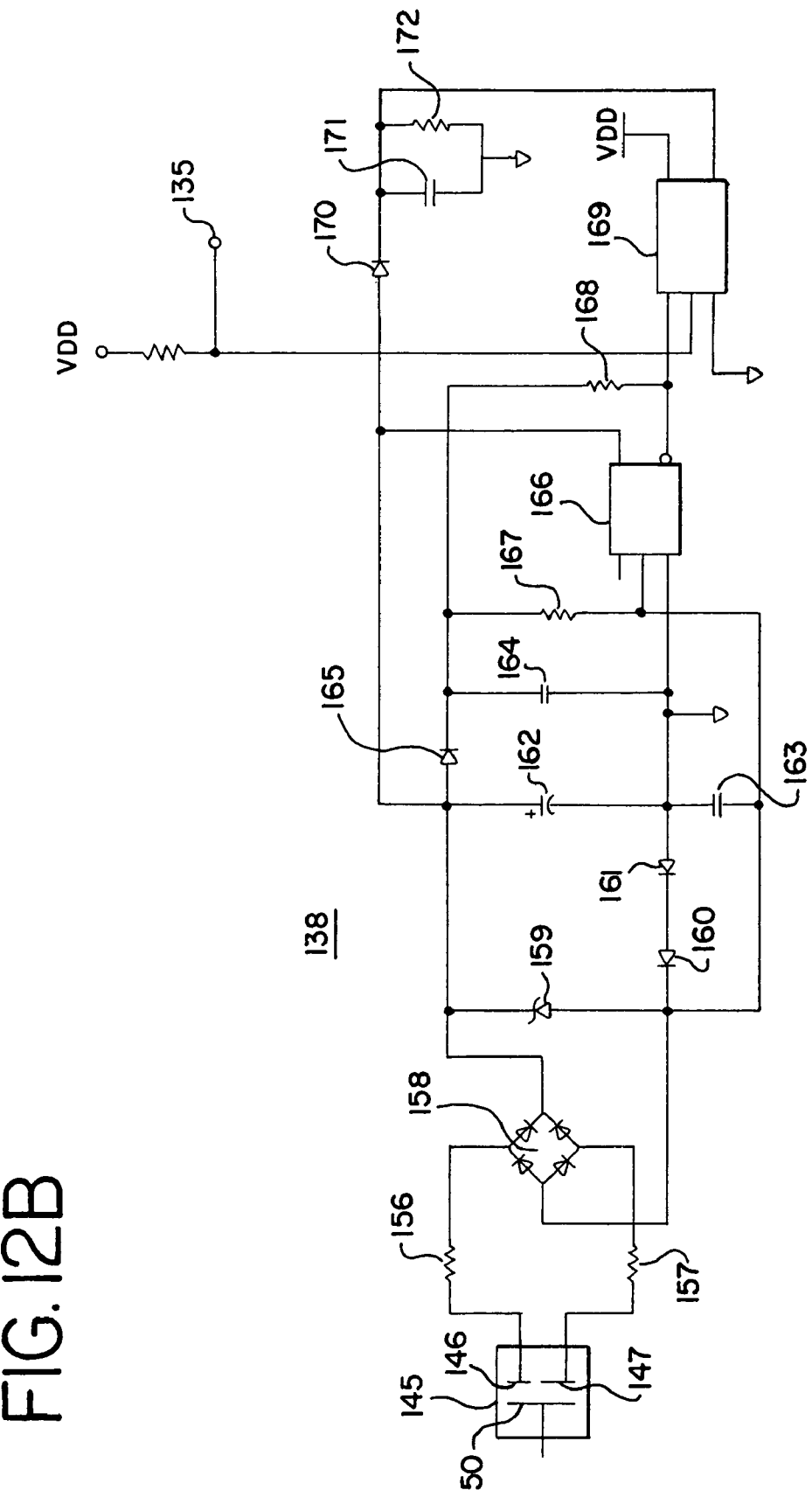
FIG. 12B is an electrical circuit diagram, to be used in conjunction with the electronic circuit diagram of FIG. 12A, to implement voltage in-rush restraint for the fault indicator of FIGS. 1–4.

It has been found that the electrostatic assembly 145 in FIG. 12B provides better immunity to stray electrical fields from adjacent electrical conductors in an electrical distribution system. For example, when the electrostatic pick up portions are somewhat physically separate, such as the plate 50 and the conductive band 51 shown in FIG. 3 of U.S. Pat. No. 6,016,105, the separate electrostatic pick up components may cause false triggering upon voltage in-rush in an adjacent conductor, instead of in the monitored conductor. Electrostatic assembly 145 of the present invention substantially avoids these unwanted stray effects and false triggering with the above-described dual electrodes on one substrate approach. That is, the electrostatic assembly 145 is highly coupled to its own conductor, and the two electrodes 146 and 147 provide excellent immunity to the stray fields of adjacent conductors.

Returning now to FIG. 12B, the basic functions of the voltage inrush restraint circuit 138 are to determine whether there is a voltage in conductor 21, such as by sensing the collapse of the electromagnetic field about conductor 21 when the voltage falls during a fault or when a reclosing relay otherwise opens, and to inhibit activation of the display 40 to the fault indicating position when power is restored to the electrical distribution system. Of course, when power is restored, as by closing of the reclosing relay, there is likely to be a subsequent current inrush or surge in conductor 21 because of the preexisting load on conductor 21. It is therefore desirable for the fault indicator 20 to avoid interpreting this current inrush as a fault condition on conductor 21.

The differential signal developed between electrodes 146 and 147 of electrostatic sensor 145 is presented through resistors 156 and 157 to opposite sides of a full-wave rectification bridge 158. Bridge 158 provides a positive voltage at the cathode terminal of a Zener diode 159, which is connected across another pair of bridge terminals. Zener diode 159 limits the rectified voltage across its terminals to about 5.6 volts. Capacitor 162 filters the input voltage. Diode 165 permits capacitor 164 to be charged, but blocks a discharge path in case the voltage across the Zener diode should drop, as may be caused by a lower electrical field at the electrostatic assembly 145.

Since activation of the electromagnetic assembly 59 that moves the flag 40 between the fault indicating position and the non-fault indicating position is now battery assisted, the capacitive value of capacitor 164 can be relatively small as compared to the prior art fault indicators that relied upon the accumulated charge on a similar capacitor to provide the sole energy for activation of the electromagnetic assembly 59. For example, capacitor 164 may be about 50 times smaller in capacitive value. Less charging current demand is therefore placed on the electrostatic sensor 145 with the present design. Since the battery-less prior art designs needed to provide charging current for operation of the electromagnetics for operation of flag 40, such prior art designs were limited in their applicability to electrical systems above about 7 kilovolts (KV). Without the burden of providing larger charging currents, electrostatic sensor 145 is now more sensitive and is capable of operating effectively in electrical systems down to 2 KV. A resistor 167 biases an input pin 2 of an inverter 166 slightly below ground, as determined by the series connected diodes 160 and 161. Inverter 166 is commercially available from ON Semiconductor under part number MC74HC1G04. Since the input pin 2 is at a logic 0, the output pin 4 of the inverter 166 will be at a logic 1. Resistor 168 functions as a pull-up resistor.

The logic 1 output of inverter 166 is presented to an input pin 1 of an analog switch 169. Analog switch 169 is commercially available from ON Semiconductor under part number MC74VHC1G66. A capacitor 171, connected to the on/off control pin 4 of analog switch 169, rapidly charges through a diode 170. However, diode 170 limits discharge of capacitor 171 through a resistor 172. The RC time constant of resistor 172 and capacitor 171 is about 10 seconds. Analog switch 169 is conductive when on/off control pin 4 is in a logic 1 state. The output of inverter 166 is then presented to the terminal 136 of AND gate 133.

Figure 12C:
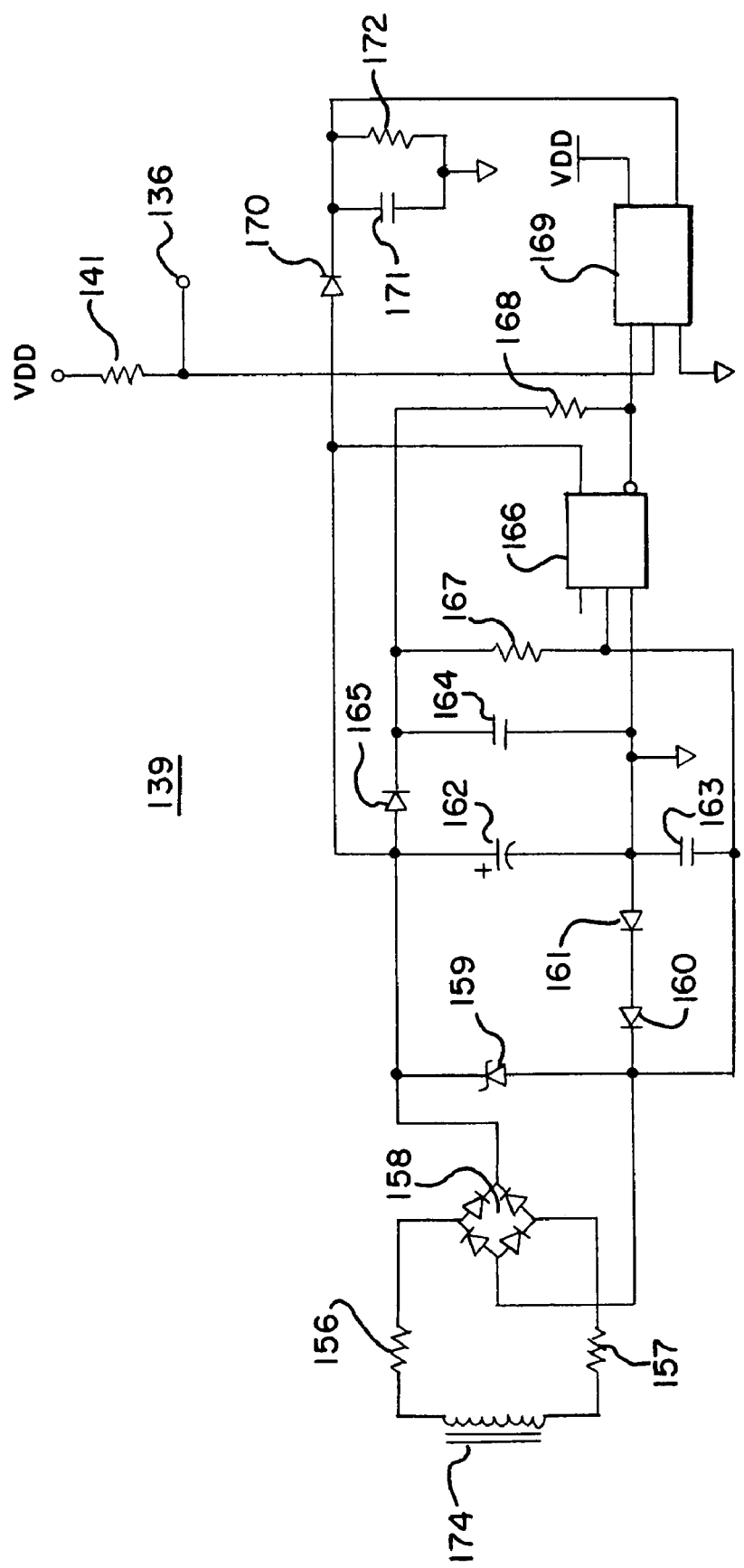
FIG. 12C is an electrical circuit diagram, to be used in conjunction with the electronic circuit diagram of FIG. 12A, to implement current in-rush restraint for the fault indicator of FIGS. 1–4.

The current in-rush restraint circuit 139 in FIG. 12C is similar to the voltage in-rush restraint circuit 138 in FIG.

12B except that the current in-rush restraint circuit 139 employs an inductive sensor 174. As seen in FIG. 3, inductive sensor 174 is disposed in the housing 30 perpendicularly and adjacently to the monitored conductor 21. Inductive sensor 174 may be a solenoid winding about a grain-oriented silicon steel core. The winding may be, for example, about 500 to 1000 turns of wire in the range of 32 to 36 gauge. The alternating current electrical field about monitored conductor 21 induces a current into the inductive sensor 174. This induced current is then presented to the current in-rush restraint circuitry 139, which operates similarly to the already described voltage in-rush restraint circuitry 138.

The above described restraint circuits 138 and 139 are effective for a wide range of applications. For example, the restraint circuits will perform effectively on 35 kilovolt lines as well as on 1.2 kilovolt lines.

An auxiliary contact circuit 140 illustrated in FIG. 12D operates a relay 186 with associated electrical contacts 190 and 191. Contacts 190 and 191 are indicative of the set or reset condition of fault indicator 20. Electrical contacts 191 and 190 are electrically presented at output terminals 187–188 and 188–189, respectively. For example, the state of contacts 190 and 191 may be provided externally of the fault indicator 20 via a pigtail 192 in FIGS. 1 and 2.

It will be appreciated that the drive circuitry for the relay 186 is configured similarly to the drive circuitry for winding 42 in FIG. 11, such as the MOSFET switches 181 and 182, the biasing resistors 179 and 180, and the signal coupling capacitors 177 and 178. Thus, switches 181 and 182 will conduct current through relay 186 in a first direction when a fault condition is detected to set the contacts 191 and 190 in a state that indicates that the fault indicator 20 is in a fault condition. Similarly, switches 181 and 182 will conduct current through relay 186 in a second or opposite direction when the timed reset occurs to reset the contacts 191 and 190 in a state that indicates that the fault indicator 20 is in a reset condition. This information on the state of contacts 191 and 190 may be provided to a remote location by pigtail 192. For example, electric utilities may use the information available about the state of contacts 190 and 191 as provided by the pigtail 192 for generally monitoring the electrical distribution system, including for control or automation purposes.

While particular embodiments of the invention have been shown and described, it will be obvious to those skilled in the art that changes and modifications may be made therein without departing from the invention in its broader aspects.

What is claimed is

1. A fault indicator for indicating the occurrence of a fault in an electrical conductor, said fault indicator comprising:
   a housing;
   a display that can be activated between a normally non-fault indicating condition and a fault indicating condition when a fault occurs in the conductor;
   means for sensing if a fault has occurred in the electrical conductor and for supplying a signal indicative of a fault condition upon determining that a fault has occurred;
   means responsive to the signal indicative of a fault condition to activate the display to indicate that a fault has occurred; and
   timed reset means to reset the display to the non-fault indicating condition a predetermined time after the display was activated to the fault indicating condition, said predetermined time for resetting the targeted display from the fault indicating condition to the non-fault indicating condition is in a range of about one hour to about 24 hours.

2. The fault indicator in accordance with claim 1 wherein the predetermined time for resetting the display from the fault indicating condition to the non-fault indicating condition is about four hours.

3. The fault indicator in accordance with claim 1 further comprising:
   delay means for delaying the signal indicative of the fault condition in a range of about one to about 50 milliseconds.

4. The fault indicator in accordance with claim 1 wherein said display is of the flag type.

5. A fault indicator for indicating the occurrence of a fault in an electrical conductor, said fault indicator comprising:
   a housing;
   a display that can be activated between a normally non-fault indicating condition and a fault indicating condition when a fault occurs in the conductor;
   a fault sensor for determining if a fault has occurred in the electrical conductor and for supplying a signal indicative of a fault condition upon determining that a fault has occurred;
   circuitry responsive to the signal indicative of a fault condition to activate the display to indicate that a fault has occurred; and
   a timer to reset the display to the non-fault indicating condition a predetermined time after the display was activated to the fault indicating condition, said predetermined time for resetting the targeted display from the fault indicating condition to the non-fault indicating condition is in a range of about one hour to about 24 hours.

6. The fault indicator in accordance with claim 5 wherein the predetermined time for resetting the display from the fault indicating condition to the non-fault indicating condition is about four hours.

7. The fault indicator in accordance with claim 5 further comprising:
   a delay circuit for delaying the signal indicative of the fault condition in a range of about one to about 50 milliseconds.

8. The fault indicator in accordance with claim 5 wherein said display is of the flag type.

9. A fault indicator for indicating the occurrence of a fault in an electrical conductor, said fault indicator comprising:
   a housing;
   a high capacity battery;
   a display that can be activated between a normally non-fault indicating condition and a fault indicating condition when a fault occurs in the conductor;
   a fault sensor for sensing if a fault has occurred in the electrical conductor and for supplying a signal indicative of a fault condition upon determining that a fault has occurred; and
   a programmable controller responsive to the signal indicative of a fault condition from the fault sensor to activate the display to indicate that a fault has occurred;
   said programmable controller having a sleep mode in which a low quiescent current is drawn from the high capacity battery such that the high capacity battery does not need replacement during the expected lifetime of the fault indicator.

10. The fault indicator in accordance with claim 9 in which the low quiescent current drawn by the programmable controller in the sleep mode is less than 10 microamperes at 25° C.

11. The fault indicator in accordance with claim 9 in which the low quiescent current drawn by the programmable controller in the sleep mode is a maximum of about 5 microamperes at 25° C.

12. The fault indicator in accordance with claim 9 in which the high capacity battery has a capacity of greater than 2 ampere-hours.

13. The fault indicator in accordance with claim 9 in which the high capacity battery is of the thionyl chloride lithium type.

14. The fault indicator in accordance with claim 9 wherein the display is of the targeted type.

15. The fault indicator in accordance with claim 9 further comprising:

timed reset means to reset the display to the non-fault indicating condition a predetermined time after the display was activated to the fault indicating condition.

* * * * *